(12) United States Patent
Shieh et al.

(10) Patent No.: US 9,455,350 B2
(45) Date of Patent: Sep. 27, 2016

(54) TRANSISTOR DEVICE STRUCTURE THAT INCLUDES POLYCRYSTALLINE SEMICONDUCTOR THIN FILM THAT HAS LARGE GRAIN SIZE

(71) Applicant: National Applied Research Laboratories, Taipei (TW)

(72) Inventors: Jia-Min Shieh, Hsinchu (TW); Wen-Hsien Huang, Hsinchu (TW); Chang-Hong Shen, Hsinchu (TW); Chih-Chao Yang, Hsinchu (TW); Tung-Ying Hsieh, Hsinchu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 24 days.

(21) Appl. No.: 14/224,503

(22) Filed: Mar. 25, 2014

(65) Prior Publication Data

US 2015/0280010 A1    Oct. 1, 2015

(51) Int. Cl.
| | |
|---|---|
| H01L 29/786 | (2006.01) |
| H01L 27/088 | (2006.01) |
| H01L 29/04 | (2006.01) |
| H01L 27/12 | (2006.01) |
| H01L 21/822 | (2006.01) |
| H01L 27/06 | (2006.01) |

(52) U.S. Cl.
CPC ..... *H01L 29/78678* (2013.01); *H01L 21/8221* (2013.01); *H01L 27/0688* (2013.01); *H01L 27/1203* (2013.01); *H01L 27/1222* (2013.01); *H01L 29/04* (2013.01); *H01L 29/78603* (2013.01); *H01L 29/78675* (2013.01)

(58) Field of Classification Search
CPC ................................................ H01L 29/78672
See application file for complete search history.

(56) References Cited

U.S. PATENT DOCUMENTS

| | | | |
|---|---|---|---|
| 6,709,910 B1 | 3/2004 | Crowder et al. | |
| 6,770,515 B1* | 8/2004 | Makita | H01L 21/2022 257/347 |
| 6,909,118 B2* | 6/2005 | Hara | H01L 29/4908 257/350 |
| 7,220,660 B2 | 5/2007 | Im et al. | |
| 2004/0055999 A1 | 3/2004 | Chen et al. | |
| 2004/0074881 A1* | 4/2004 | Oishi | B23K 26/0736 219/121.63 |
| 2009/0020817 A1* | 1/2009 | Park | H01L 21/8221 257/351 |

OTHER PUBLICATIONS

Chang-Hong Shen et al., "Monolithic 3D Chip Integrated with 500ns NVM, 3ps Logic Circuits and SRAM", 2013 IEEE International Electron Devices Meeting, Dec. 9, 2013, USA.

(Continued)

*Primary Examiner* — Stephen W Smoot
(74) *Attorney, Agent, or Firm* — WPAT, PC; Justin King (57) ABSTRACT

A transistor device structure includes a substrate, a first polycrystalline semiconductor thin film and a first transistor unit. The first polycrystalline semiconductor thin film is disposed on the substrate. A grain diameter of the first polycrystalline semiconductor thin film is greater than 1 micrometer and a thickness of the first polycrystalline semiconductor thin film is less than three hundredths of the grain diameter. The first transistor unit is disposed on the first polycrystalline semiconductor thin film and includes a first gate dielectric layer and a first gate structure. The first gate dielectric layer is disposed on a surface of the first polycrystalline thin film semiconductor. The first gate structure is disposed on a surface of the first gate dielectric layer.

16 Claims, 6 Drawing Sheets

(56) References Cited

OTHER PUBLICATIONS

Chun-Yen Chang et al., "Fabrication of Thin Film Transistors by Chemical Mechanical Polished Polycrystalline Silicon Films", IEEE Electron Device Letters, vol. 17, No. 3, Mar. 1996, pp. 100-102.

Alice B. Y. Chan et al. "Polished TFT's: Surface Roughness Reduction and Its Correlation to Device Performance Improvement", IEEE Transactions on Electron Devices, vol. 44, No. 3, Mar. 1997, pp. 455-463.

Mark A. Crowder et al., "Sequential Lateral Solidification Processing for Polycrystalline Si TFTs", IEEE Transactions on Electron Devices, vol. 51, No. 4, Apr. 2004, pp. 560-568.

Hung-Tse Chen et al., "Roughness Effect on Uniformity and Reliability of Sequential Lateral Solidified Low-Temperature Polycrystalline Silicon Thin-Film Transistor", Electrochemical and Solid-State Letters, 9 (8), Mar. 23, 2006, H81-H83.

\* cited by examiner

TRANSISTOR DEVICE STRUCTURE THAT INCLUDES POLYCRYSTALLINE SEMICONDUCTOR THIN FILM THAT HAS LARGE GRAIN SIZE

FIELD OF THE INVENTION

The present invention relates to a technology for manufacturing transistors, and more particularly to a method for manufacturing a polycrystalline semiconductor thin film and a transistor device structure using the same.

BACKGROUND OF THE INVENTION

Short channel effect (SCE) and high leakage current are getting serious in small feature-size device components when the transistors manufactured on a semiconductor substrate have a size down to 20-30 nanometers (nm). To obtain larger on-current, higher carriers mobility and lower sub-threshold swing, some specific technologies, such as novel lithography, ultra-thin gate dielectric layer, ultra-shallow junction (USJ), control of ion implantation on substrate and high dielectric constant material/metal gate, are developed. However, the manufacturing processes developed from the aforementioned technologies have faced some specific difficulties and bottlenecks.

Thus, a technical mean of silicon on insulator (SOI)/germanium on insulator (GOI) combined with fin transistor (FinFET) and gate-all-around (GAA) has been developed. Because the aforementioned technical mean has higher gate coverage and an improved gate control, the short channel effect can be effectively reduced. In addition, the substrate leakage current is also reduced when a fully depletion device element is formed by reducing the thickness of the silicon/germanium on an insulating material layer into a specific value (for example, smaller than 10 nm). By using the device component formed with undoped channel, the low field mobility and the threshold voltage variations are also improved and the random dopant fluctuation effects are reduced. In addition, the transistor operation speed is also improved by the advantages of buried oxide and no source/drain junction capacitance. Thus, the fully-depletion device elements with SOI/GOI structures have clearly become a mainstream trend in the next generation of high-performance device components.

Even the ultra-thin flat SOI/GOI has the aforementioned device component integration advantages, there still exists some difficulties, such as a high manufacturing cost, for the fabrication of the ultra-thin flat silicon/germanium thin film channel layer with a thickness smaller than 10 nm. For example, because a surface may be damaged by hits of oxygen ions during SOI/GOI process and the surface defects and charges accumulation in neutral zone may lead to the floating body effect and the kink effect, the threshold voltage may have abnormal changes in the transistor manufacture process.

Thus, it is quite necessary to solve the aforementioned issues.

SUMMARY OF THE INVENTION

An object of the present invention is to provide a polycrystalline semiconductor thin film, which has lower manufacturing cost and simpler manufacturing process features and is able to widely apply to manufacture a transistor device structure or heterogeneous monolithic 3D-ICs integration.

The present invention provides a transistor device structure, which includes a substrate, a first polycrystalline semiconductor thin film and a first transistor unit. The first polycrystalline semiconductor thin film is disposed on the substrate. A grain diameter of the first polycrystalline semiconductor thin film is greater than 1 micrometer and a thickness of the first polycrystalline semiconductor thin film is less than three hundredths of the grain diameter. The first transistor unit is disposed on the first polycrystalline semiconductor thin film and includes a first gate dielectric layer and a first gate structure. The first gate dielectric layer is disposed on a surface of the first polycrystalline thin film semiconductor. The first gate structure is disposed on a surface of the first gate dielectric layer.

The present invention further provides a transistor device structure, which includes a substrate, a first polycrystalline semiconductor thin film and a first transistor unit. The first polycrystalline semiconductor thin film is disposed on the substrate. A grain diameter of the first polycrystalline semiconductor thin film is greater than 1 micrometer and a thickness of the first polycrystalline semiconductor thin film is less than 30 nanometers. The first transistor unit is disposed on the first polycrystalline semiconductor thin film and includes a first gate dielectric layer and a first gate structure. The first gate dielectric layer is disposed on a surface of the first polycrystalline thin film semiconductor. The first gate structure is disposed on a surface of the first gate dielectric layer.

The present invention still further provides a polycrystalline semiconductor thin film, which includes a substrate and a first polycrystalline semiconductor thin film. The first polycrystalline semiconductor thin film is formed on the substrate. The first polycrystalline semiconductor thin film is transformed, by a crystallization process, from a first amorphous semiconductor thin film originally formed on the substrate. A grain diameter of the first polycrystalline semiconductor thin film is greater than 1 micrometer. A thickness of the first polycrystalline semiconductor thin film is reduced to a specific thickness by performing a thickness reduction process, and the specific thickness is less than three tenths of a thickness of the first amorphous semiconductor thin film.

In summary, because the manufacturing process disclosed in the present invention is performed at a relatively low temperature (for example, lower than 400° C.), there is no need to worry about the conventional high-temperature process may damage the electrical property of the metal back-gate structure and the stacked device components in the process of manufacturing a monolithic 3D-ICs by directly stacking more than one transistor units on a substrate formed with a metal back-gate structure. In addition, the method for manufacturing monolithic 3D-ICs and monolithic 3D-ICs using the same may also improve the positioning accuracies among these transistor units. In addition, the method for manufacturing monolithic 3D-ICs may also realize the heterogeneous integration of monolithic 3D transistor chips having different materials or functions. In addition, by using the features of lateral crystallization and columnar-shaped growth perpendicular to substrate in the low thermal budget green pulse-laser crystallization process or microwave crystallization process, flat ultrathin epi-like first polycrystalline semiconductor thin films with micron-order grain can be manufactured in the present invention; wherein the current experimental data indicates that a polished polycrystalline Si/Ge semiconductor thin film with a grain diameter about 1 nm and a film thickness about 8 nm has been successfully manufactured. In addition, because all the technologies and equipment associated with the present invention, such as the low thermal budget green pulse-laser crystallization process, the chemical mechanical polishing and the interfacial modification process, are realized by low thermal budget technology, the manufacturing method disclosed in the present invention is fully compatible with the current manufacturing process.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
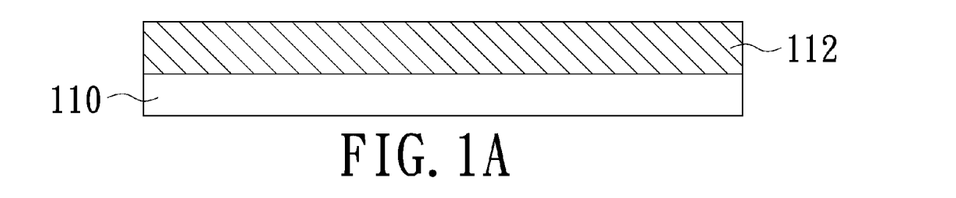
FIGS. 1A~1D are schematic diagrams illustrating a process of a method for manufacturing a polycrystalline semiconductor thin film in accordance with an embodiment of the present invention.
Figure 1B:
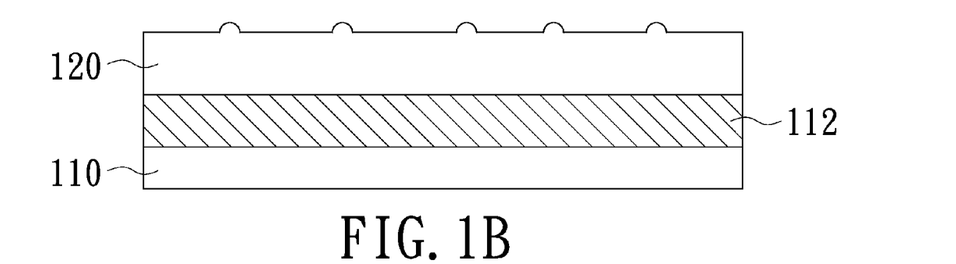

FIGS. 1A~1D are schematic diagrams illustrating a process of a method for manufacturing a polycrystalline semiconductor thin film in accordance with an embodiment of the present invention. Please refer to FIGS. 1A~1C first. As shown, the method in this embodiment includes the following steps. First, a substrate is provided. The substrate may include a semiconductor substrate 110 and a first insulating material layer 112. Specifically, the first insulating material layer 112 is formed on a surface of the semiconductor substrate 110, as illustrated in FIG. 1A. The semiconductor substrate 110 may be a silicon (Si) substrate; and the first insulating material layer 112 may be silicon oxide. Next, a first amorphous semiconductor thin film 120 is formed on a surface of the first insulating material layer 112, as illustrated in FIG. 1B. Specifically, the first amorphous semiconductor thin film 120 may include some specific semiconductor materials such as amorphous silicon, amorphous germanium (Ge) or amorphous silicon-germanium (SiGe). The formation of the first amorphous semiconductor thin film 120 may be realized by plasma enhanced chemical vapor deposition (PECVD) or other low-temperature deposition processes; but the present invention is not limited thereto.

Figure 1C:
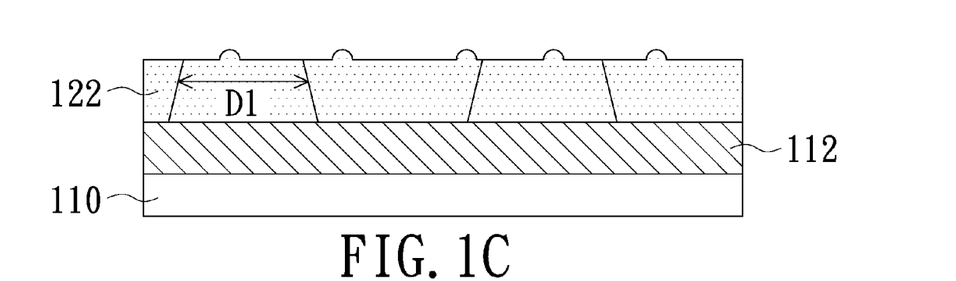

Please refer to FIGS. 1B and 1C together. Next, a crystallization process is performed to induce the micron-order grains in the first amorphous semiconductor thin film 120 so as to transform the first amorphous semiconductor thin film 120 into a first polycrystalline semiconductor thin film 122, as illustrated in FIG. 1C. The grain diameter D1 of the first polycrystalline semiconductor thin film 122 may be larger than 1 micrometer (nm). The aforementioned crystallization process may be a low thermal budget green pulse-laser crystallization process or a microwave-anneal crystallization process.

It is to be noted that the aforementioned the low thermal budget green pulse-laser crystallization process or microwave-anneal crystallization process has some specific advantages, such as lateral crystallization and columnar-shaped growth perpendicular to substrate. In addition, it is to be noted that the grain size of the first polycrystalline semiconductor thin film 122 is related to the thickness of the first amorphous semiconductor thin film 120 when the low thermal budget green pulse-laser crystallization process or microwave-anneal crystallization process is selected to be adopted. Specifically, the grain size of the first polycrystalline semiconductor thin film 122 increases with the thickness of the first amorphous semiconductor thin film 120; and a related device component can have an improved electrical property if a first polycrystalline semiconductor thin film 122 having a larger grain size is selected. Thus, by first performing the crystallization process on the selected first amorphous semiconductor thin film 120 having a larger thickness and then performing a thickness reduction process thereon, a flat ultrathin epi-like first polycrystalline semiconductor thin film 122 with micron-order grain can be manufactured. The relationship between the thickness of the amorphous semiconductor thin 120 film and the grain size of the corresponding polycrystalline semiconductor thin film 122 will be discussed in detail in the paragraphs related to FIGS. 2A~2D.

Figure 1D:
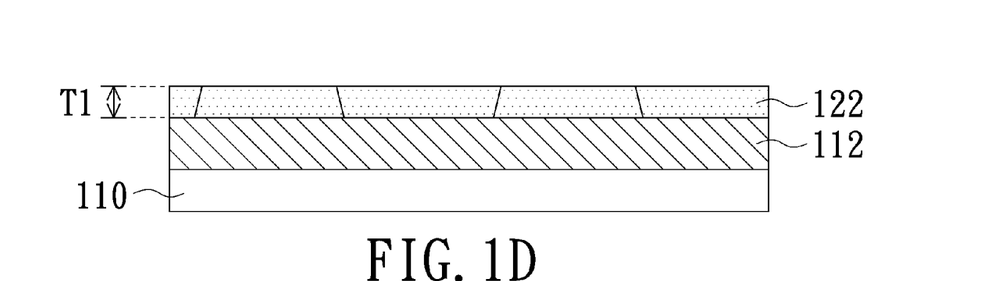

Please refer to FIGS. 1C and 1D together. Next, a thickness reduction process is performed to reduce the thickness of the first polycrystalline semiconductor thin film 122 shown in FIG. 1C into a specific thickness T1, and thereby the first polycrystalline semiconductor thin film 122 with micron-order grain (herein the first polycrystalline semiconductor thin film 122 may also referred to as a flat ultra-thin epi-like first polycrystalline semiconductor thin film) is formed, as illustrated in FIG. 1D. The aforementioned specific thickness T1 may be smaller than three tenths of the thickness of the first amorphous semiconductor thin film 120; or smaller than one tenth of the thickness of the first amorphous semiconductor thin film 120; or smaller than three hundredths of the grain diameter D1 of the first polycrystalline semiconductor thin film 122. The aforementioned thickness reduction process may be a nano-order or micro-order chemical mechanical polishing. In addition, it is understood that the aforementioned thickness reduction process can also improve the surface roughness of the first polycrystalline semiconductor thin film 122 (for example, reduce the surface roughness to smaller than 0.5 nanometer (nm)) while the thickness of the first polycrystalline semiconductor thin film 122 is being reduced.

Please refer to FIG. 1D. Once the thickness reduction process is complete, hydrophobic Si—H bonding or hydrophobic Ge—H bonding may be formed on a surface of the Si/Ge first polycrystalline semiconductor thin film 122 due to the alkaline solution used in the chemical mechanical polishing process. Even being processed by the post-clean of alkaline solution, not all the metal ions can be effectively removed from the polishing liquid; and accordingly a relatively-large number of interface defects may occur on a surface of the first crystalline semiconductor thin film 122. Thus, to optimize a surface of the polished first polycrystalline semiconductor thin film 122 and reduce the interface defect density thereon, a multi-phase low-temperature interfacial modification process may be performed on the first crystalline semiconductor thin film 122 shown in FIG. 1D after the thickness reduction process is complete. The multi-phase low-temperature interfacial modification process may include the following steps. First, the first polycrystalline semiconductor thin film 122 is immersed into a 75° C. first mixture solution for 10 minutes; wherein a component of the first mixture solution may include of $NH_4OH:H_2O_2:H_2O=1:4:20$. Next, the first polycrystalline semiconductor thin film 122 is immersed into a 75° C. second mixture solution for 10 minutes; wherein a component of the second mixture solution may include of $HCl:H_2O_2:H_2O=1:1:6$. Next, the first polycrystalline semiconductor thin film 122 is immersed into a 75° C. pure $H_2O_2$ solution for 10 minutes or performed by a low-temperature plasma oxidation process to form a sacrificial oxide layer thereon. Then, after removing the sacrificial oxide layer by using dilute hydrofluoric acid solution, the multi-phase low-temperature surface modification process as well as the process for manufacturing a polycrystalline semiconductor thin film is complete. It is to be noted that the aforementioned multi-phase low-temperature interfacial modification process may further reduce the thickness of the flat ultra-thin epi-like first polycrystalline semiconductor thin film 122 with micro-order grain by about 1 to 2 nm.

Figure 2A:
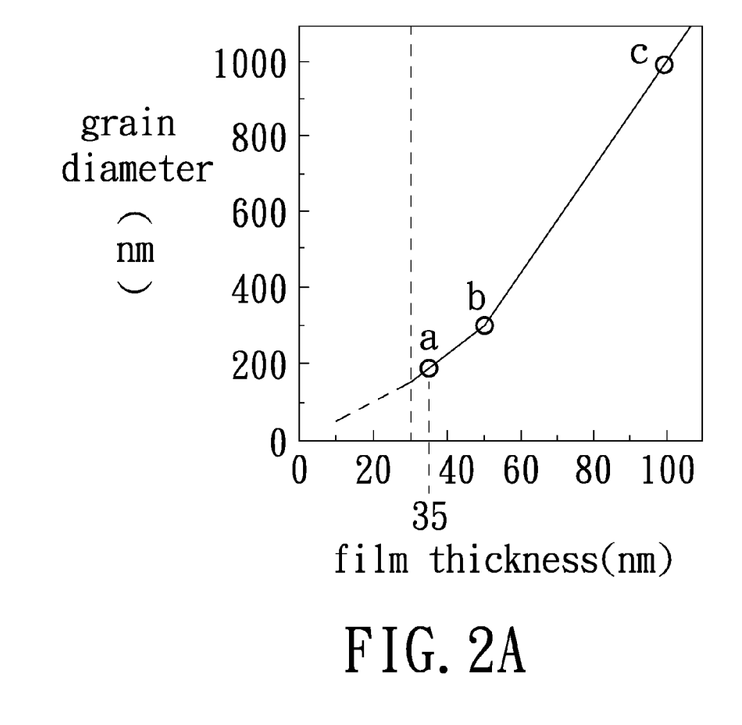
FIG. 2A is a chat illustrating a relationship between the thickness of an amorphous semiconductor thin film and the grain size of a corresponding polycrystalline semiconductor thin film.
Figure 2B:
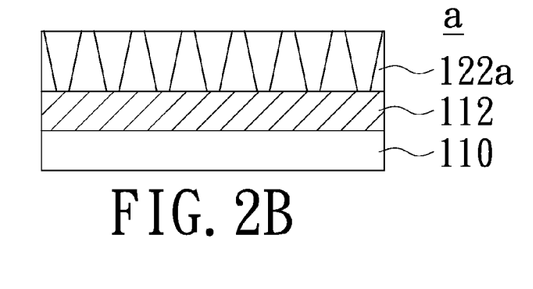
FIGS. 2B~2D are schematic diagrams illustrating the drain sizes corresponding to the three different film thicknesses of the corresponding amorphous semiconductor thin film shown in FIG. 2A.
Figure 2C:
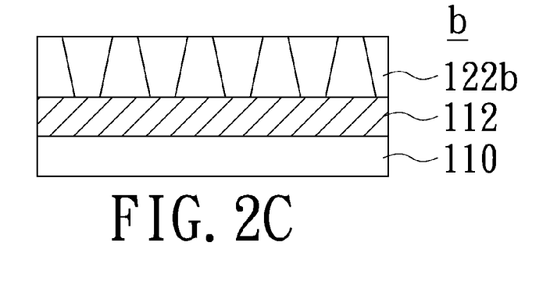
Figure 2D:
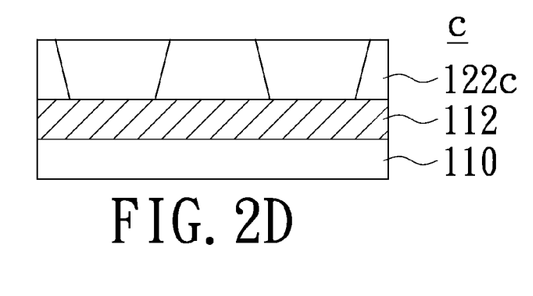

The following is a discussion of the relationship between the thickness of an amorphous semiconductor thin film and the grain size of a corresponding polycrystalline semiconductor thin film under a use of the low thermal budget green pulse-laser crystallization process. Herein three polycrystalline semiconductor thin films are formed by performing the low thermal budget green pulse-laser crystallization process on three respective amorphous semiconductor thin films having different respective film thicknesses (that is, 35 nm, 50 nm and 100 nm). FIG. 2A is a chat illustrating a relationship between the thickness of an amorphous semiconductor thin film and the grain size of a corresponding polycrystalline semiconductor thin film. In addition, FIGS. 2B-2D are schematic diagrams illustrating the grain sizes corresponding to the three different film thickness states (that is, states a, b and c shown in FIG. 2A) of the amorphous semiconductor thin film, respectively. Please refer to FIGS. 2A-2D together. As shown, a polycrystalline semiconductor thin film 122a having a grain diameter about 200 nm is formed when a corresponding amorphous semiconductor thin film having a film thickness 35 nm is used, as illustrated in FIGS. 2A and 2B; a polycrystalline semiconductor thin film 122b having a grain diameter about 300 nm is formed when a corresponding amorphous semiconductor thin film having a film thickness 50 nm is used, as illustrated in FIGS. 2A and 2C; and a polycrystalline semiconductor thin film 122c having a grain diameter about 1000 nm is formed when a corresponding amorphous semiconductor thin film having a film thickness 100 nm is used, as illustrated in FIGS. 2A and 2D. It is understood that the maximum grain size 1000 nm in FIG. 2A is for an exemplary purpose only, and the present invention is not limited thereto. In addition, it is to be noted that the polycrystalline semiconductor thin film may not form with grain if the film thickness of the corresponding amorphous semiconductor thin film is down to 30 nm, for example. In summary, a relatively-thick amorphous semiconductor thin film is helpful for the formation of the polycrystalline semiconductor thin film with relatively-large grain. Furthermore, the monocrystalline-like characteristics of the polycrystalline semiconductor thin film with relatively-large grain are closer to the crystalline characteristics; thus, the probability of a device component crossing the lattice border area is effectively reduced and the device component accordingly has improved electrical properties.

In the present invention, it is found that even the chemical mechanical polishing is performed to reduce a polycrystalline semiconductor thin film with a grain diameter greater than 1000 nm from a film thickness 100 nm to 20 nm, the polished polycrystalline semiconductor thin film with a film thickness 20 nm still has a grain diameter greater than 1000 nm. Thus, the low thermal budget green pulse-laser crystallization process indeed has the advantages of lateral crystallization and columnar-shaped growth perpendicular to substrate and the grain diameter difference between two different film thicknesses is relatively small. In addition, because the current experimental data indicates that a polished polycrystalline Si/Ge semiconductor thin film with a grain diameter about 1000 nm and a film thickness about 8 nm has been successfully manufactured, the aforementioned specific thickness T1 of the polished first polycrystalline semiconductor thin film 122 may be reduced to eight hundredths of the thickness of the first amorphous semiconductor thin film 120 or even smaller.

Figure 3:
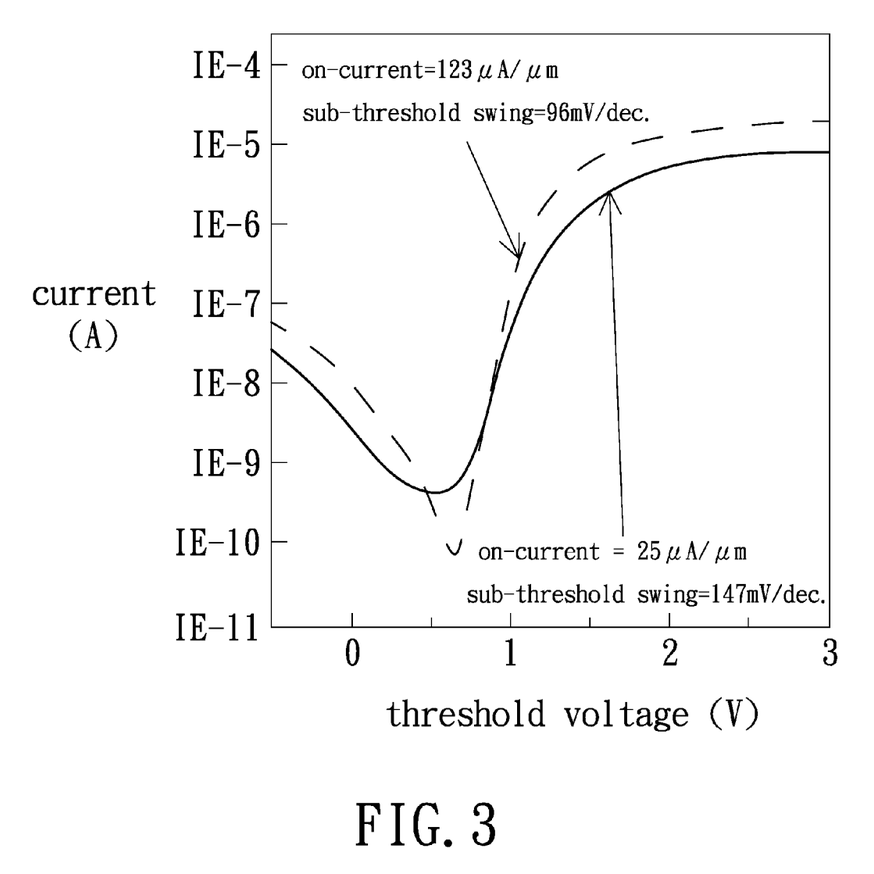
FIG. 3 is a chart illustrating the electrical property variation of a polycrystalline semiconductor thin film before and after being processed by the chemical mechanical polishing and the interfacial modification process.

The electrical property variation of a transistor device resulted by the surface defect on a polycrystalline semiconductor thin film will be discussed in FIG. 3, which is a chart illustrating the electrical property variation between a polycrystalline semiconductor thin film before being processed by a thickness reduction process (for example, the chemical mechanical polishing) and a polycrystalline semiconductor thin film after being processed by a thickness reduction process (for example, the chemical mechanical polishing) and the surface modification process. In FIG. 3, specifically, the solid line is derived from the polycrystalline semiconductor thin film before being processed by the chemical mechanical polishing and having a film thickness 50 nm; the dashed line is derived from the polycrystalline semiconductor thin film after being processed by the chemical mechanical polishing and the surface modification process and having a film thickness reduced from 100 nm to 50 nm; and the two lines are obtained based on a related gate having a length 50 nm and a width 50 nm. As shown in FIG. 3, after being processed by the chemical mechanical polishing and the interfacial modification process, the polycrystalline semiconductor thin film can have improved electrical properties. For example, the sub-threshold swing is reduced from 147 mV/decade to 96 mV/decade; the threshold voltage is reduced from 0.92V to 0.8V; the On/Off ratio is increased from $1\times10^7$ to $2\times10^7$; the on-current is increased from 25 $\mu A/\mu m$ to 123 $\mu A/\mu m$); and the carrier mobility is increased from 72 $cm^2/V\text{-}s$ to 185 $cm^2/V\text{-}s$.

Figure 4A:
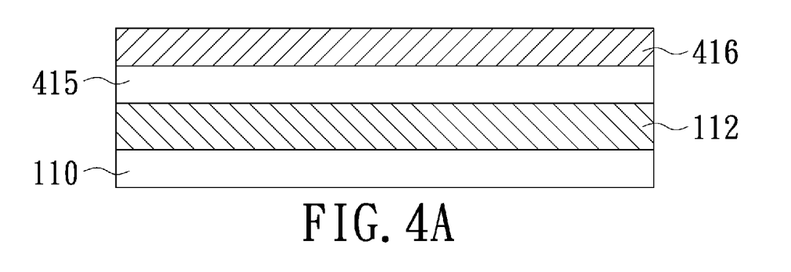
FIGS. 4A~4D are schematic diagrams illustrating a process of a method for manufacturing a transistor device structure having a polycrystalline semiconductor thin film in accordance with an embodiment of the present invention.
Figure 4B:
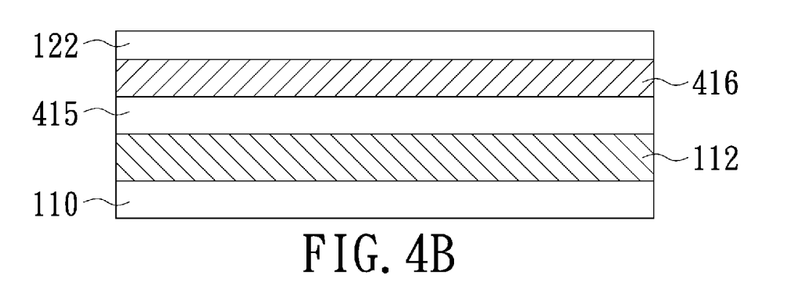

The method for manufacturing a polycrystalline semiconductor thin film provided by the present invention may be applied to manufacture a transistor device structure. FIGS. 4A~4D are schematic diagrams illustrating a process of a method for manufacturing a transistor device structure having a polycrystalline semiconductor thin film in accordance with an embodiment of the present invention. Please refer to FIGS. 4A and 4B first. As shown, the method in this embodiment includes the following steps. First, a substrate is provided. The substrate may include a semiconductor substrate 110, a first insulating material layer 112, a metal back-gate structure 415 and a second insulating material layer 416. Specifically, the first insulating material layer 112 is formed on a surface of the semiconductor substrate 110; the metal back-gate structure 415 is formed on a surface of the first insulating material layer 112; and the second insulating material layer 416 is formed on a surface of the metal back-gate structure 415, as illustrated in FIG. 4A. Next, an ultra-thin first polycrystalline semiconductor thin film 122 (for example, with a thickness less than 8 nm) is formed on a surface of the second insulating material layer 416, as illustrated in FIG. 4B. The process for forming the first polycrystalline semiconductor thin film 122 is similar to the process illustrated in FIGS. 1B~1D, and no redundant detail is to be given herein. The metal back-gate structure 415 may include tantalum nitride (TaN), titanium nitride (TiN), aluminum/silicon/copper alloy (AlSiCu) or some conductive materials with a melting point higher than 650° C.

Figure 4C:
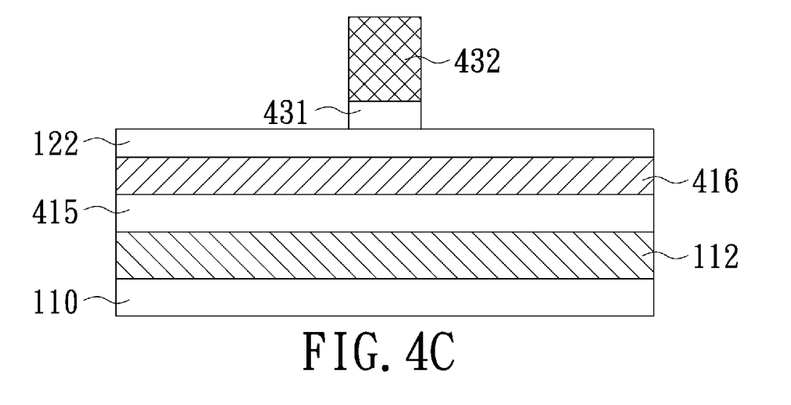
Figure 4D:
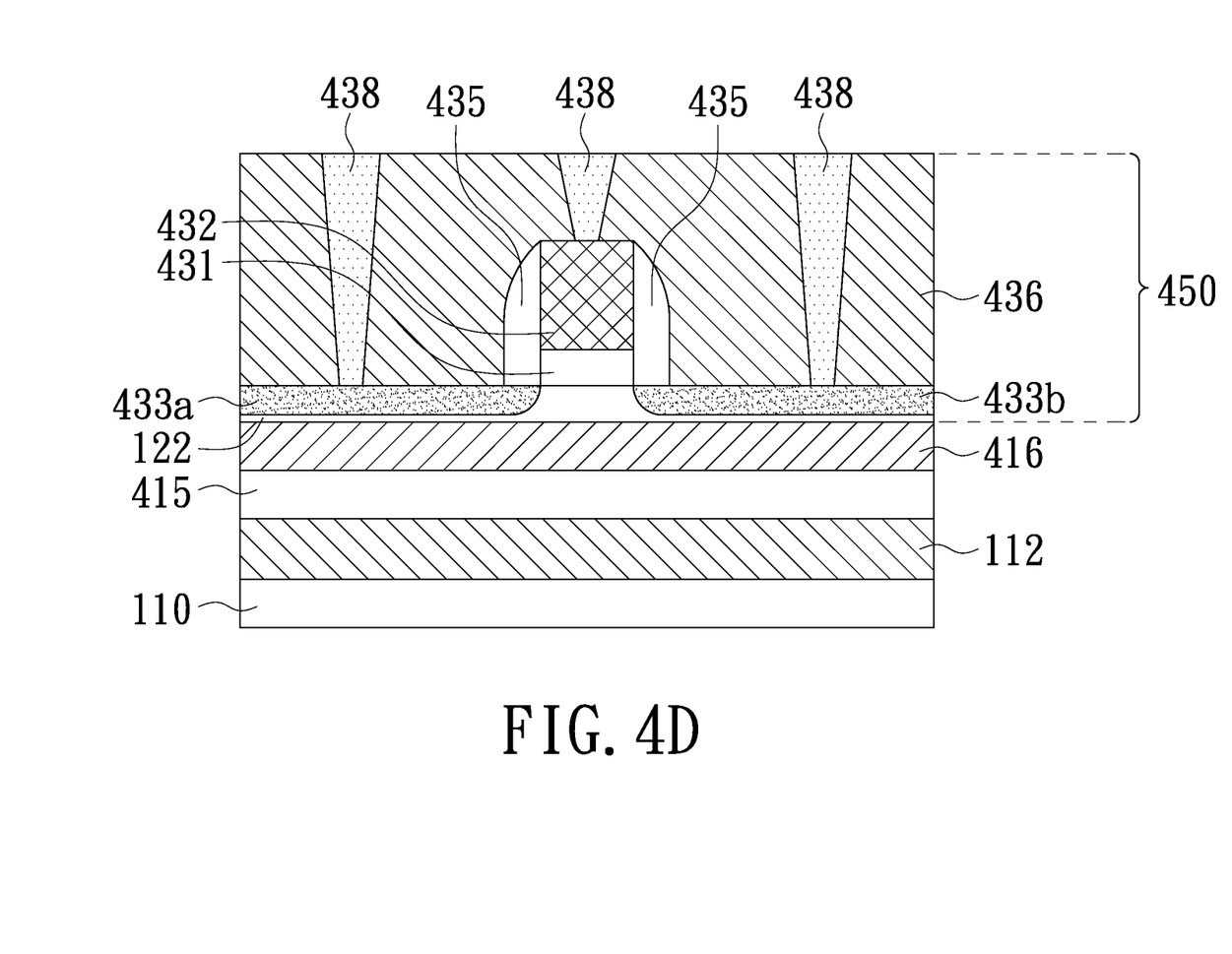

Please refer to FIGS. 4C and 4D together. After the formation of the first polycrystalline semiconductor thin film 122 is complete, a first transistor unit is then formed on a surface of the first polycrystalline semiconductor thin film 122. The formation of the first transistor unit may include the following steps. First, a first gate dielectric layer 431 is formed on a surface of the first polycrystalline semiconductor thin film 122 and then a first gate structure 432 is formed on a surface of the first gate dielectric layer 431, as illustrated in FIG. 4C. Next, a first drain region 433a and a first source region 433b are formed by using the first gate structure 432 and the first gate dielectric layer 431 as a mask and performing a doping process on an exposed part of the first polycrystalline semiconductor thin film 122; wherein the first polycrystalline semiconductor thin film 122 formed with the first drain region 433a and the first source region 433b is functioned as a channel layer of a transistor unit. Next, a spacer 435 is formed on the sidewalls of the first gate structure 432 and the first gate dielectric layer 431; wherein the spacer layer 435 is also disposed on specific parts of surfaces of the first drain region 433a and the first source region 433b. Next, a third insulating material layer 436 is formed on the first drain region 433a, the first source region 433b, the spacer 435 and the first gate structure 432. Then, a metal via plug 438 is formed; wherein the metal via plug 438 penetrates through the third insulating material layer 436 and contacts to the first drain region 433a, the first source region 433b and the first gate structure 432.

Figure 5:
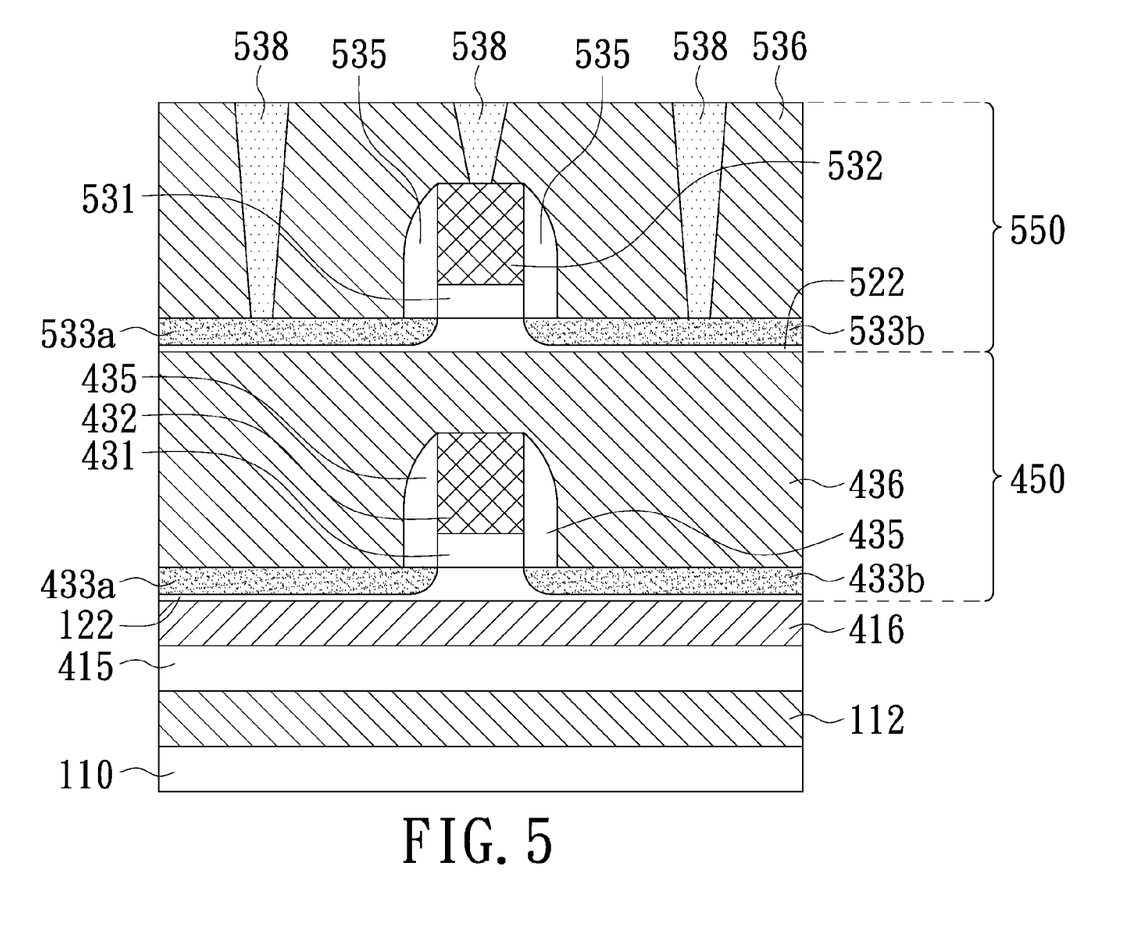
FIG. 5 is a schematic structural diagram illustrating a process of a method for manufacturing monolithic 3D-ICs having a polycrystalline semiconductor thin film in accordance with an embodiment of the present invention.

It is to be noted that the method for manufacturing a polycrystalline semiconductor thin film provided by the present invention may be realized by low thermal budget technology and may be applied to manufacture a heterogeneous monolithic 3D-IC. FIG. 5 is a schematic structural diagram illustrating a process of a method for manufacturing a monolithic 3D-IC having a polycrystalline semiconductor thin film in accordance with an embodiment of the present invention. Besides the described process of manufacturing the structure shown in FIG. 4D, the method for manufacturing a monolithic 3D-IC having a polycrystalline semiconductor thin film in this embodiment further includes the following steps. First, a second polycrystalline semiconductor thin film 522 is directly formed on the third insulating material layer 436. Next, a second gate dielectric layer 531 is formed on a surface of the second polycrystalline semiconductor thin film 522 and then a second gate structure 532 is formed on a surface of the second gate dielectric layer 531. Next, a second drain region 533a and a second source region 533b are formed by using the second gate structure 532 and the second gate dielectric layer 531 as a mask and performing the doping process on an exposed part of the second polycrystalline semiconductor thin film 522. Then, a spacer 535, a fourth insulating material layer 536 and a metal via plug 538 are sequentially formed, and thereby a second transistor unit 550 is formed. It is to be noted that the metal via plug 438 (FIG. 4D) is not shown in FIG. 5 due to the metal via plug 538 and the metal via plug 438 are not necessary to be formed at the same section position. In addition, it is to be noted that the processes for manufacturing the spacer 535, the fourth insulating material layer 536 and the metal via plug 538 of the second transistor unit 550 are similar to that of the spacer 435, the third insulating material layer 436 and the metal via plug 438 of the first transistor unit 450, and no redundant detail is to be given herein. In one embodiment, one or more transistor units may further sequentially stacked on the second transistor unit 550 to manufacture transistor-based application devices such as the volatile memory, non-volatile memory or logic circuit; and the present invention is not limited thereto.

It is to be noted that in the monolithic 3D-ICs having a plurality of transistor units, an inner dielectric layer of each adjacent two stack transistor devices (for example, the third insulating material layer 436 or the fourth insulating material layer 536) may have a thickness less than 300 nm; thus, the length of the metal via plug (for example, the metal via plug 438 or 538), formed between the adjacent two stack transistor devices and functioned as a metal interconnection, is accordingly shorten. In addition, the method for manufacturing a polycrystalline semiconductor thin film provided by the present invention may be also applied to manufacture a fin field-effect transistor (FinFET) or a monolithic 3D FinFET device.

In summary, because the manufacturing process disclosed in the present invention is performed at a relatively low temperature (for example, lower than 400° C.), there is no need to worry about the conventional high-temperature process may damage the electrical property of the metal back-gate structure and the stacked device components in the process of manufacturing a monolithic 3D transistor device structure by directly stacking more than one transistor units on a substrate formed with a metal back-gate structure. In addition, the method for manufacturing a monolithic 3D transistor device structure and a monolithic 3D-IC using the same may also improve the positioning accuracies among these transistor units. In addition, the method for manufacturing a monolithic 3D-IC may also realize the heterogeneous integration of monolithic 3D transistor chips having different materials or functions. In addition, by using the features of lateral crystallization and columnar-shaped growth perpendicular to substrate in the low thermal budget green pulse-laser crystallization process or microwave-anneal crystallization process, flat ultrathin epi-like first polycrystalline semiconductor thin films with micron-order grain can be manufactured in the present invention; wherein the current experimental data indicates that a polished polycrystalline Si/Ge semiconductor thin film with a grain diameter about 1000 nm and a film thickness about 8 nm has been successfully manufactured. In addition, because all the technologies and equipment associated with the present invention, such as the low thermal budget green pulse-laser crystallization process, the chemical mechanical polishing and the interfacial modification process, are realized by low thermal budget technology, the manufacturing method disclosed in the present invention is fully compatible with the current manufacturing process.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A transistor device structure, comprising:
    a substrate;
    a first polycrystalline semiconductor thin film disposed on the substrate, wherein a surface roughness of the first polycrystalline semiconductor thin film is smaller than 0.5 nm, a grain diameter of the first polycrystalline semiconductor thin film is greater than 1 micrometer, and a thickness of the first polycrystalline semiconductor thin film is less than three hundredths of the grain diameter; and
    a first transistor unit disposed on the first polycrystalline semiconductor thin film and comprising:
        a first gate dielectric layer disposed on a surface of the first polycrystalline semiconductor thin film; and
        a first gate structure disposed on a surface of the first gate dielectric layer.

2. The transistor device structure according to claim 1, wherein the substrate comprises:
    a semiconductor substrate; and
    an insulating material layer disposed on a surface of the semiconductor substrate, wherein the first polycrystalline semiconductor thin film is disposed on a surface of the insulating material layer.

3. The transistor device structure according to claim 1, wherein the substrate comprises:
    a semiconductor substrate;
    a first insulating material layer disposed on a surface of the semiconductor substrate;
    a metal back-gate structure disposed on a surface of the first insulating material layer; and
    a second insulating material layer disposed on a surface of the metal back-gate structure, wherein the first polycrystalline semiconductor thin film is disposed on a surface of the second insulating material layer.

4. The transistor device structure according to claim 1, further comprising:
    a third insulating material layer;
    a second polycrystalline semiconductor thin film; and
    a second transistor unit,
    wherein the third insulating material layer is disposed on the first transistor unit, the second polycrystalline semiconductor thin film is disposed on the third insulating material layer, the second transistor unit is arranged on a surface of the second polycrystalline semiconductor thin film, and the second transistor unit and the first transistor units have a same film layer structure.

5. The transistor device structure according to claim 4, wherein a thickness of the third insulating material layer is less than 300 nanometers.

6. The transistor device structure according to claim 4, wherein a grain diameter of the second polycrystalline semiconductor thin film is greater than 1 micrometer.

7. The transistor device structure according to claim 1, wherein a sub-threshold swing of the first polycrystalline semiconductor thin film is less than 147 mV/decade.

8. The transistor device structure according to claim 1, wherein a threshold voltage of the first polycrystalline semiconductor thin film is less than 0.92V.

9. The transistor device structure according to claim 1, wherein a length of the first gate structure is less than 50 nm.

10. A transistor device structure, comprising:
    a substrate;
    a first polycrystalline semiconductor thin film disposed on the substrate, wherein a surface roughness of the first polycrystalline semiconductor thin film is smaller than 0.5 nm, a grain diameter of the first polycrystalline semiconductor thin film is greater than 1 micrometer, and a thickness of the first polycrystalline semiconductor thin film is less than 30 nanometers; and
    a first transistor unit disposed on the first polycrystalline semiconductor thin film and comprising:
        a first gate dielectric layer disposed on a surface of the first polycrystalline semiconductor thin film; and
        a first gate structure disposed on a surface of the first gate dielectric layer.

11. The transistor device structure according to claim 10, wherein the substrate comprises:
    a semiconductor substrate; and
    an insulating material layer disposed on a surface of the semiconductor substrate, wherein the first polycrystalline semiconductor thin film is disposed on a surface of the insulating material layer.

12. The transistor device structure according to claim 10, wherein the substrate comprises:
    a semiconductor substrate;
    a first insulating material layer disposed on a surface of the semiconductor substrate;
    a metal back-gate structure disposed on a surface of the first insulating material layer; and
    a second insulating material layer disposed on a surface of the metal back-gate structure, wherein the first polycrystalline semiconductor thin film is disposed on a surface of the second insulating material layer.

13. The transistor device structure according to claim 10, further comprising:
    a third insulating material layer;
    a second polycrystalline semiconductor thin film; and
    a second transistor unit,
    wherein the third insulating material layer is disposed on the first transistor unit, the second polycrystalline semiconductor thin film is disposed on the third insulating material layer, the second transistor unit is arranged on a surface of the second polycrystalline semiconductor thin film, and the second transistor unit and the first transistor units have a same film layer structure.

14. The transistor device structure according to claim 10, wherein a sub-threshold swing of the first polycrystalline semiconductor thin film is less than 147 mV/decade.

15. The transistor device structure according to claim 10, wherein a threshold voltage of the first polycrystalline semiconductor thin film is less than 0.92V.

16. The transistor device structure according to claim 10, wherein a length of the first gate structure is less than 50 nm.

* * * * *